(12) United States Patent
Renz

(10) Patent No.: US 7,477,056 B2
(45) Date of Patent: Jan. 13, 2009

(54) BIRDCAGE RESONATOR WITH COUPLING RINGS IN ADDITION TO THE FERRULES

(75) Inventor: Wolfgang Renz, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/867,150

(22) Filed: Oct. 4, 2007

(65) Prior Publication Data

US 2008/0094063 A1    Apr. 24, 2008

(30) Foreign Application Priority Data

Oct. 24, 2006    (DE) ...................... 10 2006 050 069

(51) Int. Cl.
*G01V 3/00* (2006.01)
(52) U.S. Cl. ...................... 324/318; 324/322
(58) Field of Classification Search .................. 324/318, 324/322
See application file for complete search history.

(56) References Cited

U.S. PATENT DOCUMENTS

| | | | |
|---|---|---|---|
| 4,885,539 A | 12/1989 | Roemer et al. | |
| 5,804,969 A * | 9/1998 | Lian et al. | 324/318 |
| 6,316,941 B1 | 11/2001 | Fujita et al. | |
| 6,396,271 B1 | 5/2002 | Burl et al. | |
| 6,522,143 B1 * | 2/2003 | Fujita et al. | 324/318 |
| 6,842,003 B2 * | 1/2005 | Heid et al. | 324/318 |
| 6,943,551 B2 * | 9/2005 | Eberler et al. | 324/318 |
| 7,227,360 B2 * | 6/2007 | Jevtic et al. | 324/318 |
| 7,292,038 B2 * | 11/2007 | Doty | 324/318 |

* cited by examiner

*Primary Examiner*—Louis M Arana
(74) *Attorney, Agent, or Firm*—Schiff Hardin LLP

(57) ABSTRACT

A birdcage resonator for magnetic resonance applications has two ferrules disposed in spaced-apart parallel ferrule planes. A line connecting the ferrule centers defines the antenna axis of the birdcage resonator, which orthogonally intersects the ferrule planes. The birdcage resonator has a number of antenna rods regularly distributed around the antenna axis, extending from ferrule to ferrule. The birdcage resonator has two coupling rings in addition to the ferrules that surround the antenna axis in respective coupling ring planes orthogonal to the antenna axis, and that are spaced from but coupling with the ferrules. The coupling rings are tuned to cause the ferrules to be resonant at frequencies other than without the coupling rings. The ferrules couple with one another in common eigenmodes, namely a common mode with a common mode frequency, and a push-pull mode with a push-pull frequency differing from the common mode frequency. The coupling rings are tuned such that the frequency of one of the eigenmodes does not correspond with any resonance frequency of the antenna rods. A feed device feeds electrical energy into the ferrules at the frequency of the eigenmode that corresponds with no resonance frequency of the antenna rods.

7 Claims, 2 Drawing Sheets

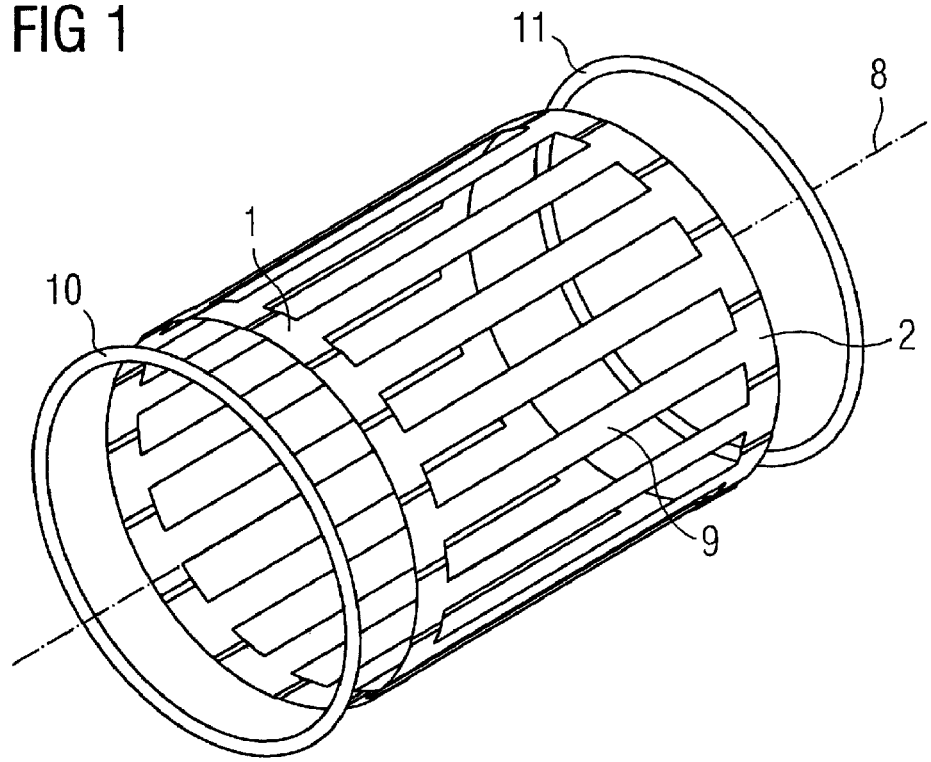
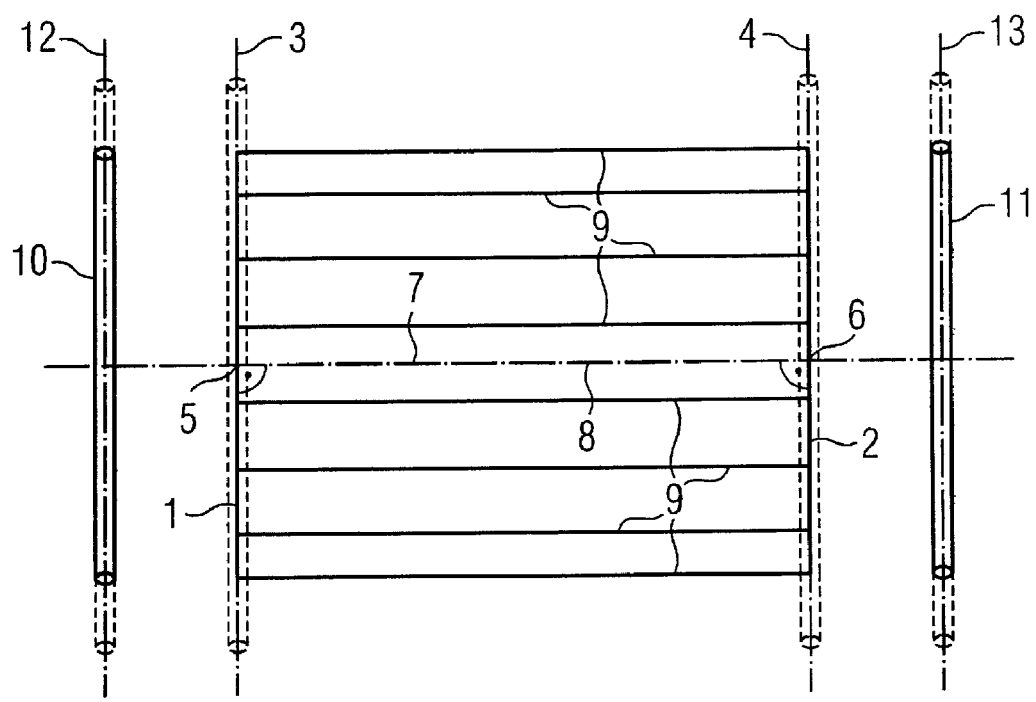

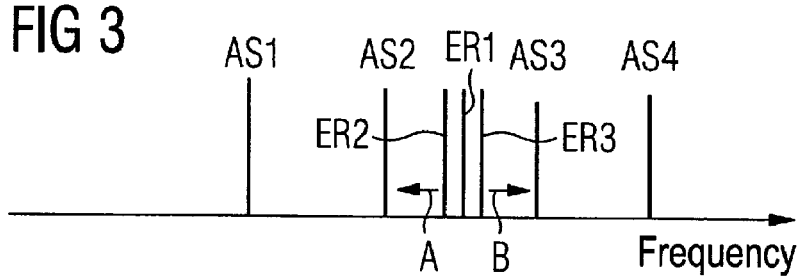
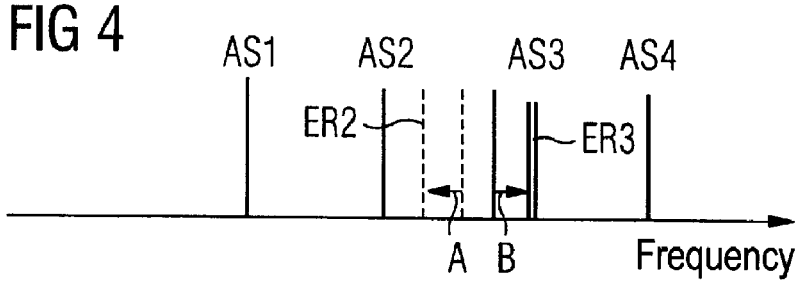
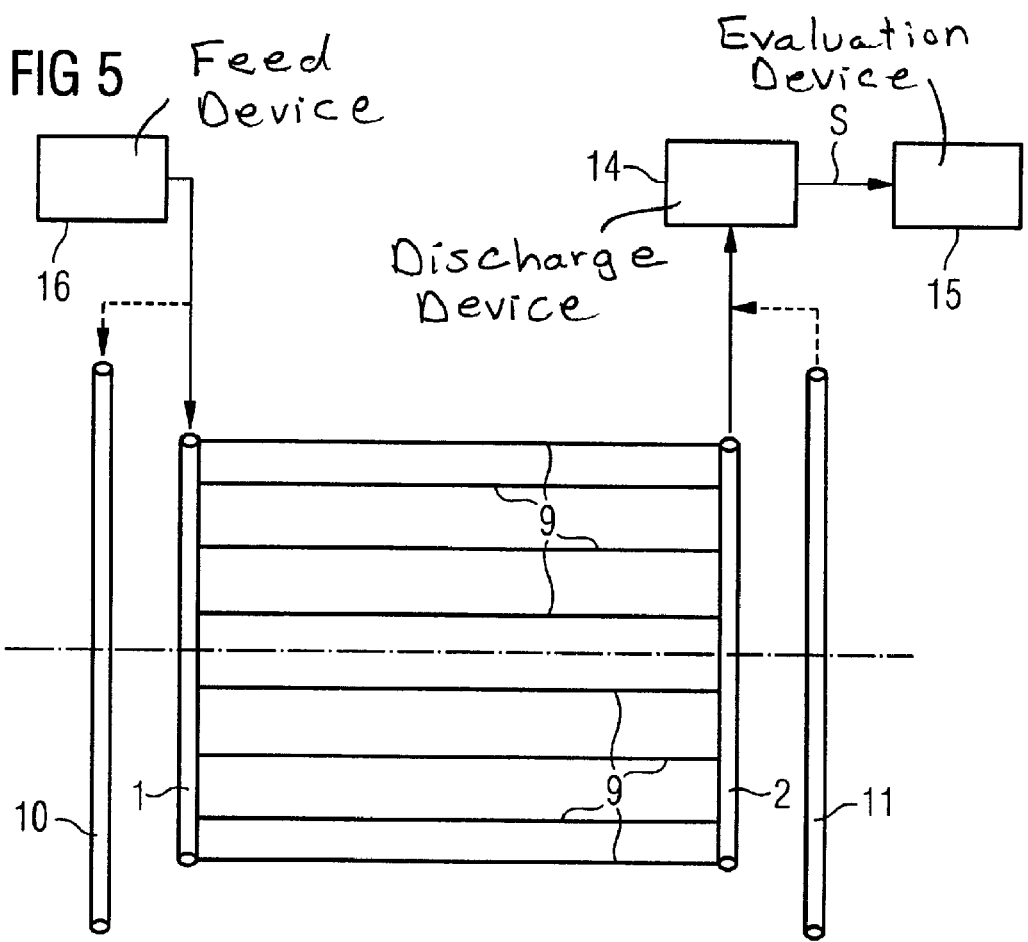

BIRDCAGE RESONATOR WITH COUPLING RINGS IN ADDITION TO THE FERRULES

BACKGROUND OF THE INVENTION

1. Field of the Invention

The present invention concerns a birdcage resonator for magnetic resonance applications.

2. Description of the Prior Art

Birdcage resonators for magnetic resonance apparatuses are generally known. They are normally constructed as follows.

The birdcage resonator has a first ferrule and a second ferrule disposed in ferrule planes parallel to one another and spaced from one another. The ferrules exhibit ferrule centers. A connection line of the ferrule centers with one another defines an antenna axis of the birdcage resonator which orthogonally intersects the ferrule planes. The birdcage resonator furthermore has a number of antenna rods that are distributed regularly (normally uniformly) around the antenna axis. Each antenna rod extends from the first ferrule to the second ferrule.

In magnetic resonance systems, birdcage resonators are used almost without exception as transmission antennas for excitation of magnetic resonances. Furthermore, they are also used as whole-body reception antennas for magnetic resonance systems as well as, in some cases, as local coils (for example as head coils). The reason for their use is in particular that birdcage resonators exhibit clear advantages with regard to the design and properties relative to possible alternative solutions.

In birdcage resonators, capacitors are arranged in the antenna rods and/or in the ferrules, the birdcage resonator being tuned by means of those capacitors. Depending on the arrangement of the capacitors, the birdcage resonator is designed as high-pass, as low-pass or as band-pass.

One of the disadvantages of birdcage resonators is what is known as ferrule modes, meaning currents that oscillate in the ferrules. The ferrule modes are parasitic resonances. They can be influenced only to a limited extent in birdcage resonators of the prior art. In the prior art the ferrule modes are disadvantageous since, in individual cases, they can be disruptive for the magnetic resonance imaging. A utilization of the ferrule modes is not known in the prior art.

In the prior art it is sought to place the frequencies of the ferrule modes in frequency ranges that are sufficiently far removed from the operating frequencies of the birdcage resonator, thus normally the frequencies with which currents oscillate in the antenna rods. This is not always possible, however. Due to other boundary conditions that must be achieved to depending on the circumstance of the individual case.

U.S. Pat. No. 4,885,539 discloses a birdcage resonator of the type described above that has a first coupling ring and a second coupling ring in addition to the typical elements described in the preceding. The first coupling ring proceeds around the antenna axis in a first coupling ring plane orthogonal to the antenna axis and is spaced from the first ferrule, but couples therewith. The second coupling ring proceeds around the antenna axis in a second coupling ring plane orthogonal to the antenna axis and is spaced from the second ferrule, but couples therewith. The coupling rings are tuned such that the ferrules are resonant at different frequencies than without the coupling rings. A similar disclosure can be learned from U.S. Pat. No. 6,396,271.

A birdcage resonator is known from U.S. Pat. No. 6,316,941, in which the frequency of one of the ferrules modes coincides with the frequency of one of the other modes and is utilized for reception of magnetic resonance signals.

It is possible that the ferrules are spaced so far from one another that they do not couple with one another, but the ferrules normally couple with one another such that, as a common eigenmode, they exhibit a common mode with a common mode frequency and a push-pull mode with a push-pull frequency differing from the common mode frequency.

SUMMARY OF THE INVENTION

An object of the present invention is to provide a birdcage resonator in which at least one of the ferrule modes is meaningfully utilized.

The object is achieved by a birdcage resonator in accordance with the invention wherein the coupling rings are tuned such that the frequency of one of the eigenmodes corresponds with no resonance frequency of the antenna rods. In this case the birdcage resonator can have a feed device with which electrical energy can be fed into the ferrules with the frequency of the eigenmode that corresponds with no resonance frequency of the antenna rods. For example, an object that is located inside the volume defined by the birdcage resonator can be supplied with energy. Examples of such possible objects are surface coils and patient monitoring devices.

The coupling rings essentially couple exclusively with the ferrules due to their arrangement and design, but not with the antenna rods and the currents oscillating in the antenna rods. The tuning of the coupling rings therefore does influence the ferrule modes, but not the other resonance frequencies of the birdcage resonator.

The eigenmode whose frequency corresponds with no resonance frequency of the antenna rods is advantageously the common mode. The common mode is preferable for this purpose because it exhibits a very homogeneous magnetic field in the direction of the antenna axis and its magnetic field runs parallel to the antenna axis.

It is possible for the coupling rings to be tuned such that the frequency of one of the eigenmodes lies in proximity to a resonance frequency of the antenna rods. When this is the case, the appertaining eigenmode is advantageously the push-pull mode. The push-pull mode with its transversal field portions can be utilized, for example, as an additional acquisition mode.

It is also possible for the birdcage resonator to exhibit a discharge device and an evaluation device arranged downstream from the discharge device. In this case electrical energy oscillating in the ferrules with the frequency of one of the eigenmodes can be discharged from the ferrules and demodulated by means of the discharge device. A demodulated signal discharged from the ferrules can in this case be evaluated by the evaluation device.

For example, direct magnetic resonance signals can be acquired in this manner. Alternatively or additionally, it is possible for local coils to convert their magnetic resonance signals to a different frequency than the magnetic resonance signals and transmit on this other frequency. The reception signals of the local coils from the discharge device can be evaluated by an evaluation device. Identifiers from transponders (known as RFIDs) that, for example, are located on local coils or the like, can also be queried and evaluated.

BRIEF DESCRIPTION OF THE DRAWINGS

FIG. 1 schematically illustrates in a perspective view, an inventive birdcage resonator.

FIG. 2 is a longitudinal section through the birdcage resonator of FIG. 1.

FIGS. 3 and 4 are frequency diagrams for explaining the invention.

FIG. 5 is a schematic block diagram of the birdcage resonator of FIG. 1.

DESCRIPTION OF THE PREFERRED EMBODIMENTS

As shown in FIGS. 1 and 2, a birdcage resonator for magnetic resonance applications has a first ferrule 1 and a second ferrule 2. The ferrules 1, 2 are disposed in ferrule planes 3 and 4, respectively. The ferrule planes 3, 4 are parallel to one another. They exhibit a distance from one another, are thus spaced from one another.

The ferrules 1, 2 are normally of equal size. They can alternatively exhibit sizes different from one another. Furthermore, the ferrules 1, 2 are normally circular, but can alternatively exhibit a different shape, for example elliptical.

The ferrules 1, 2 exhibit ferrule centers 5, 6. The ferrule centers 5, 6 correspond to the center of gravity of the ferrules 1, 2. A connection line 7 of the ferrule centers 5, 6 with one another defines an antenna axis 8 of the birdcage resonator. The antenna axis 8 intersects the ferrules planes 3, 4 orthogonally.

The antenna axis 8 defines a cylindrical coordinate system. The terms "axial", "radial" and "tangential" used herein are always referred to the antenna axis 8. "Axially" means a direction parallel to the antenna axis 8. "Radial" means a direction perpendicular to the antenna axis 8, toward or away from the antenna axis 8. "Tangential" means a direction perpendicular to the antenna axis 8 and perpendicular to the radial direction around the antenna axis 8.

The birdcage resonator comprises a number of antenna rods 9 in addition to the ferrules 1, 2. The number of antenna rods 9 is at least four. However, the number of antenna rods 9 is normally greater than four. It can be a whole-number multiple of 4, for example 8, 12, 16 or 20 antenna rods 9. The antenna rods 9 are regularly distributed around the antenna axis 8. They can be distributed uniformly around the antenna axis 8.

Each antenna rod 9 extends from the first ferrule 1 to the second ferrule 2. The antenna rods 9 normally proceed in a straight line, meaning that each antenna rod 9 proceeds in a plane that is defined by the antenna axis 8 and the respective antenna rod 9. Usually each antenna rod 9 proceeds exactly axially, but it is also possible for the antenna rods 9 turn slightly around the antenna axis 8 (similar to the rifling grooves and lands in the barrel of a firearm), thus exhibit a spin.

To the extent described above, the inventive birdcage resonator corresponds to a conventional birdcage resonator. Such a birdcage resonator exhibits a number of axial resonance modes AS1 . . . AS$ (see FIG. 3) in which currents oscillate from one ferrule 1 to the other ferrule 2 and back in the antenna rods 9. The shown number of four axial resonance modes AS1 . . . AS4 is hereby purely exemplary. The birdcage resonator will in all cases operate near to one of the axial resonance modes AS1 . . . AS4. Its operating frequency thus lies near to one of the axial resonance modes AS1 . . . AS4.

In order to achieve an optimally good correlation of the operating frequency (or of the operating frequencies) of the birdcage resonator and the axial resonance modes AS1 . . . AS4, tuning capacitors are arranged in the ferrules 1, 2 and/or in the antenna rods 9. This procedure is generally known and typical. The tuning capacitors are not shown as well in the figures.

Furthermore, ferrule modes ER1, ER2, ER3 are plotted in FIG. 3 as further resonance modes of the birdcage resonator in addition to the axial resonance modes AS1 . . . AS4. Currents can oscillate in the ferrules 1, 2 in the ferrule modes ER1 . . . ER3.

The ferrule mode ER1 occurs in both ferrules 1, 2 when the two ferrules do not couple with one another, or couple with one another only to a slight extent. This corresponds to a ferrule frequency. If the two ferrules 1, 2 couple strongly with one another, the ferrules 1, 2 exhibit a common mode ER2 and a push-pull mode ER3 as common eigenmodes instead of the ferrule mode ER1. In the common mode ER2 the currents in the first ferrule 1 and second ferrule 2 oscillate in the same manner relative to one another; in the push-pull mode ER3 they oscillate inversely relative to one another.

The axial resonance modes AS1 . . . AS4 and the ferrules modes ER1 . . . ER3 correspond to the resonance frequencies of the birdcage resonator given a conventional design. However, in addition to the ferrules 1, 2 the birdcage resonator according to the invention has a first coupling ring 10 and s second coupling ring 11. The coupling rings 10, 11 are disposed in perspective coupling ring planes 12, 13 around the antenna axis 8. The coupling ring planes 12, 13 are orthogonal to the antenna axis 8 and thus run parallel to the ferrule planes 3, 4.

The first coupling ring 10 is spaced from the first ferrule 1, but couples therewith. The second coupling ring 10 is likewise spaced from the second ferrule 2, but couples therewith. The coupling rings 10, 11 are tuned such that the ferrules 1, 2 are resonant at other frequencies than without the coupling rings 10, 11. The tuning of the coupling rings 10, 11 can, for example, ensue by the insertion of capacitors in the coupling rings 10, 11.

For example, the birdcage resonator exhibits the axial resonance modes AS1 . . . AS4 and the ferrule modes ER2, ER3, the axial resonance modes AS1 . . . AS4 remains unchanged in spite of the presence of the coupling rings 10, 11. In contrast to this, the ferrule modes ER2, ER3 are shifted. This is indicated by arrows A, B in FIG. 3.

According to FIGS. 1 and 2, the coupling ring planes 12, 13 are different from the ferrule planes 3, 4. In this case the coupling rings 10, 11 can exhibit the same or a larger radial distance from the antenna axis 8 than the respective corresponding ferrule 1, 2. The first case (identical radial distance) is shown with solid lines in FIG. 2; the second case (larger radial distance) is indicated dashed. In all cases the coupling ring planes 12, 13 are indicated axially outside of the ferrule planes 3, 4. The first ferrule plane 3 thus lies axially between the first coupling ring plane 12 and the second ferrule plane 4; the second ferrule plane lies axially between the first ferrule plane 3 and the second coupling ring plane 13.

Alternatively, the coupling rings 10, 11 can be in the ferrule planes 3, 4. In this case the coupling rings 10, 11 are arranged radially outside of the ferrules 1, 2. This case is also indicated dashed in FIG. 2.

The three embodiments described in the preceding are equivalent in principle. Independent of which embodiment is realized, however, the geometric separation of the first coupling ring 10 from the first ferrule 1 is advantageously constant as a function of the tangential position, but this is not absolutely required. For example, when the coupling rings 10, 11 exhibit an elliptical structure and the ferrules 1, 2 exhibit a circular structure, the distance of the coupling rings 10, 11 from the respective corresponding ferrule 1, 2 varies with the tangential position.

Due to the inventive addition of the coupling rings 10, 11 it is possible to tune the coupling rings 10, 11 such that the frequency of one of the eigenmodes ER1 . . . ER3 of the ferrules 1, 2 lies near to an operating frequency of the antenna rods 9, thus near to one of the axial resonance modes AS1 . . . AS4. For example, the push-pull mode ER3 can be shifted such that the frequency of the push-pull mode ER3 is identical to, or essentially identical to, the axial resonance mode AS3.

Alternatively or additionally, it is possible to tune the coupling rings 10, 11 such that the frequency of one of the ferrule modes ER1 . . . ER3 corresponds with no operating frequency of the antenna rods 9. For example, the common mode ER2 can be shifted such that the frequency of the common mode ER2 is far removed from all axial resonance modes AS1 . . . AS4.

The two case embodiments explained in the preceding are shown in FIG. 4. In FIG. 4 the unshifted frequencies of the common mode ER2 and the push-pull mode ER3 (thus the frequencies which would result without the coupling rings 10, 11) are plotted dashed. The shifted frequencies of the common mode ER2 and the push-pull mode ER3 as well as the axial resonance modes AS1 . . . AS4 are plotted with solid lines. The arrows A and B should indicate the frequency shift. The representation of the axial resonance mode AS3 and the shifted push-pull mode ER3 next to one another in FIG. 4 ensues only for reasons of better presentation. The frequencies can alternatively deviate slightly from one another or even be identical to one another.

In the simplest case, the tuning of the coupling rings 10, 11 ensues such that both ferrule modes ER2, ER3 exhibit frequencies that correspond with no resonance frequency AS1 . . . AS4 of the antenna rods 9. In this case in particular the ferrule modes ER2, ER3 are excited only to a slight extent and do not interfere in the magnetic resonance imaging.

It is alternatively possible to use ferrule modes ER2, ER3 in a targeted manner. FIG. 5 schematically shows a plurality of usage possibilities of the ferrule modes ER2, ER3 that are independent from one another in principle.

When one of the frequencies of the ferrule modes ER2, ER3 (these are exemplarily explained using the frequency of the push-pull mode ER3) corresponds with a resonance frequency of the antenna rods 9 (or, respectively, lies in proximity to this), the birdcage resonator can comprise a discharge device 14 and an evaluation device 15 arranged downstream from the discharge device 14. In this case a magnetic resonance signal received from the ferrules 1, 2 can be directly discharged from the ferrules 1, 2 (or alternatively from the coupling rings 10, 11) and demodulated by means of the discharge device 14. An electrical signal whose frequency corresponds to the respective operating frequency of the birdcage resonator (therefore corresponds to the frequency of one of the axial resonance modes AS1 . . . AS4 and therefore possibly corresponds to the frequency of the respective ferrule mode ER3) can thus be directly discharged and demodulated. The demodulated signal (designated with S in FIG. 5) is supplied to the evaluation device 15 that can, in this case, take the signal into account in the magnetic resonance imaging.

An electrical signal also can be discharged in analogous manner from the ferrules 1, 2 and/or the coupling rings 10, 11, the frequency of which electrical signal is different from all operating frequencies of the birdcage resonator. For example, a local coil (not shown in FIG. 5) can convert a received magnetic resonance signal to the frequency of the common mode ER2 and thus transmit its measurement signal via the ferrules 1, 2 or, respectively, the coupling rings 10, 11 and the discharge device 14 to the evaluation device 15 without disruption of the reception operation of the antenna rods 9. Reception of other signals is also possible, for example identifier signals from transponders.

As shown in FIG. 5 it is possible for the birdcage resonator to have a feed device 16 by means of which electrical energy can be fed into the ferrules 1, 2 and/or the coupling rings 10, 11. The feed advantageously ensues at the frequency of one of the ferrule modes ER2, ER3, with the frequency with which it is fed corresponding with no resonance frequency AS1 . . . AS4 of the antenna rods 9.

A targeted influencing of the ferrule modes ER1 . . . ER3 independent of the axial resonance modes AS1 . . . AS4 is possible by means of the inventive birdcage resonator. The inventive birdcage resonator therefore exhibits superior operating properties relative to conventional birdcage resonators.

Although modifications and changes may be suggested by those skilled in the art, it is the intention of the inventor to embody within the patent warranted hereon all changes and modifications as reasonably and properly come within the scope of his contribution to the art.

I claim as my invention:

1. A birdcage resonator for a magnetic resonance apparatus, said birdcage resonator comprising:
   a first ferrule and a second ferrule respectively disposed in ferrule planes that are parallel to and spaced from one another, each of said first and second ferrules having a ferrule center and a line connecting the respective ferrule centers defining an antenna axis that orthogonally intersects the respective ferrule planes;
   a plurality of antenna rods regularly distributed around said antenna axis, each antenna rod extending from said first ferrule to said second ferrule, said antenna rods exhibiting multiple resonant frequencies;
   a first coupling ring and a second coupling ring, in addition to said first and second ferrules;
   said first coupling ring surrounding said antenna axis in a first coupling plane orthogonal to the antenna axis and being spaced from, but coupling with, said first ferrule;
   said second coupling ring surrounding said antenna axis in a second coupling ring plane orthogonal to the antenna axis, and being spaced from, but coupling with, said second ferrule;
   said first and second coupling rings being tuned to cause the respective first and second ferrules coupled therewith to be resonant at frequencies other than without the respective first and second coupling rings;
   said ferrules coupling with each other in common eigenmodes including a common mode at a common mode frequency and a push-pull mode at a push-pull frequency differing from the common mode frequency;
   said first and second coupling rings being tuned to cause the frequency of one of the eigenmodes to correspond to no resonant frequency of the antenna rods; and
   a feed device that feeds electrical energy into the ferrules at the frequency of the eigenmode that corresponds with no resonant frequency of the antenna rods.

2. A birdcage resonator as claimed in claim 1 wherein said coupling rings are tuned so that the eigenmode at a frequency corresponding with no resonance frequency of the antenna rods is the common mode.

3. A birdcage resonator as claimed in claim 1 wherein said coupling rings are tuned so that the frequency of one of eigenmodes is proximate to one of the resonant frequencies of the antenna rods.

4. A birdcage resonator as claimed in claim 3 wherein the eigenmode at a frequency proximate to one of the resonant frequencies of the antenna rods is the push-pull mode.

5. A birdcage resonator as claimed in claim 1 comprising:
- a discharge device connected to the ferrules that taps electrical energy oscillating in the ferrules at the frequency of one of the eigenmodes, and that demodulates said electrical energy to produce a demodulated signal; and
- an evaluation device connected to the discharge device that evaluates the demodulated signal.

6. A birdcage resonator as claimed in claim 1 wherein said first coupling ring plane is spaced from said first ferrule plane and wherein said second coupling ring plane is spaced from said second ferrule plane.

7. A birdcage resonator as claimed in claim 1 wherein said first coupling ring plane coincides with said first ferrule plane and wherein said second coupling ring plane coincides with said second ferrule plane.

\* \* \* \* \*